(12) United States Patent
Mitikiri

(10) Patent No.: US 7,796,077 B2
(45) Date of Patent: Sep. 14, 2010

(54) HIGH SPEED HIGH RESOLUTION ADC USING SUCCESSIVE APPROXIMATION TECHNIQUE

(75) Inventor: Yujendra Mitikiri, Hyderabad (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/199,803

(22) Filed: Aug. 28, 2008

(65) Prior Publication Data

US 2009/0073018 A1   Mar. 19, 2009

(30) Foreign Application Priority Data

Sep. 13, 2007 (IN) .................... 2065/CHE/2007

(51) Int. Cl.
H03M 1/12 (2006.01)
(52) U.S. Cl. ................ 341/156; 341/118; 341/120; 341/155; 341/172
(58) Field of Classification Search ......... 341/118–122, 341/155–172
See application file for complete search history.

(56) References Cited

U.S. PATENT DOCUMENTS

| 4,641,129 | A | | 2/1987 | Doluca et al. | |
|---|---|---|---|---|---|
| 5,675,340 | A | * | 10/1997 | Hester et al. | 341/156 |
| 6,603,415 | B1 | * | 8/2003 | Somayajula | 341/118 |
| 6,667,707 | B2 | | 12/2003 | Mueck et al. | |
| 6,828,927 | B1 | * | 12/2004 | Hurrell et al. | 341/156 |
| 7,038,609 | B1 | * | 5/2006 | Hurrell | 341/156 |
| 7,265,694 | B2 | * | 9/2007 | Guidry | 341/120 |
| 7,432,844 | B2 | * | 10/2008 | Mueck et al. | 341/163 |
| 7,501,965 | B2 | * | 3/2009 | Janakiraman | 341/118 |
| 7,515,083 | B2 | * | 4/2009 | Chen et al. | 341/156 |
| 7,576,678 | B2 | * | 8/2009 | Chatal et al. | 341/163 |
| 2005/0078026 | A1 | * | 4/2005 | Cai | 341/162 |
| 2009/0109079 | A1 | * | 4/2009 | Ahmad | 341/156 |
| 2009/0184857 | A1 | * | 7/2009 | Furuta et al. | 341/156 |

OTHER PUBLICATIONS

Brian P. Ginsburg and Anantha P. Chandrakasan, "500-MS/s 5-bit ADC in 65-nm CMOS With Split Capacitor Array DAC", vol. 42, No. 4, IEEE, Dated: Apr. 4, 2007, pp. 739-747.

Jieh-Tsorng Wu and Bruce A. Wooley, "A 100-MHz Pipelined CMOS Comparator", vol. 23, No. 6, IEEE, Dated: Dec. 6, 1988, pp. 1379-1385.

James L. McCreary and Paul R. Gray, "All-MOS Charge Redistribution Analog-to-Digital Conversion Techniques—Part I", vol. SC-10, No. 6, IEEE, Dated Dec. 6, 1975, pp. 371 to 379.

Shanthi Pavan, Yannis P. Tsividis and Krishnaswamy Nagaraj, "Widely Programmable High-Frequency Continuous-Time Filters in Digital CMOS Technology", vol. 35, No. 4, IEEE, Dated: Apr. 2000, pp. 503 to 511.

* cited by examiner

*Primary Examiner*—Linh V Nguyen
(74) *Attorney, Agent, or Firm*—John J. Patti; Wade J. Brady, III; Frederick J. Telecky, Jr.

(57) ABSTRACT

An analog to digital converter (ADC) containing a sub-ADC to resolve at least some of the bits using successive approximation principle (SAP), while providing various improvements. According to one aspect, another sub-ADC is used to resolve some of the bits in parallel. According to another aspect, the sub-ADC using SAP is implemented using a charge redistribution principle, while another sub-ADC does not rely on charge conservation. According to yet another aspect of the present invention, a same component operates as a comparator when the sub-ADC using SAP resolves the corresponding bits, and operates as an amplifier when the sub-ADC generates a residue signal.

14 Claims, 5 Drawing Sheets

HIGH SPEED HIGH RESOLUTION ADC USING SUCCESSIVE APPROXIMATION TECHNIQUE

RELATED APPLICATION

The present application claims the benefit of co-pending India provisional application serial number: 2065/CHE/2007, entitled: "A Multi bit High-speed High-resolution SAR ADC", filed on Sep. 13, 2007, naming Texas Instruments Inc. (the intended assignee) as the Applicant, and naming Yujendra Mitikiri as an inventor, attorney docket number: TXN-923, and is incorporated in its entirety herewith.

BACKGROUND

1. Field of the Invention

The present invention relates generally to analog to digital converters (ADC), and more specifically to a high-speed high-resolution ADC that uses successive approximation techniques.

2. Related Art

Analog to digital converters (ADCs) are used to generate a sequence of digital codes representing the respective signal levels of an analog signal as is well known in the relevant art. In general, an ADC receives a reference voltage also as input, with the voltage indicating the maximum input voltage level.

Assuming the ADC is to generate an N-bit digital code on a linear scale, a digital code ideally equals (Vin * $2^N$/Vref), wherein Vref, Vin, * and / respectively represent the reference voltage, voltage level of a sample of the input signal, multiplication operator and division operator. In addition, a voltage level corresponding to one least significant bit (LSB) equals (Vref/$2^N$).

ADCs often employ successive approximation principle (SAP) for such a conversion. In a typical SAP based implementation, each bit of a digital code (with the digital code representing a sample of the analog signal) is determined in a single iteration, starting from the most significant bit. To determine the most significant bit, the most significant bit is set to a specific logical value (e.g., 1) and the following bits to the other logical value (0), and the resulting number is converted to an intermediate analog signal (generally using a digital to analog converter (DAC), contained in the ADC).

Assuming the specific logical value equals 1, the value of the most significant bit of the digital code is determined to equal 0 if the sample of the analog signal has less voltage than the intermediate analog signal, or else to 1. The next significant bit may be set to 1 (while setting the most significant bit to the determined value) and the following bits to 0, and the resulting number is used to generate a new intermediate analog signal.

The new intermediate analog signal is compared with the sample of the analog signal to determine the corresponding (next significant) bit of the digital code. The approach is continued until all the bits of the digital code are determined. Other digital codes representing an analog signal may be generated at a desired sampling interval.

SAP technique is often used for reasons such as simplicity of implementation, accuracy of output, etc. However, one problem with SAP technique is that the throughput performance of the technique is low (i.e., may take a long duration to complete a conversion) due to the iterative nature of resolving the value of each bit position.

The problem is compounded in case ADCs are to be implemented with a high resolution (number of bits in each converted digital code) since the number of iterations according to SAP may equal the number of bits in each digital code. It is therefore desirable to provide ADCs using SAP, but with high throughput performance.

SUMMARY

An analog to digital converter (ADC) provided according to an aspect of the present invention includes a first sub-ADC to resolve a first set of bits of a digital code in a parallel mode, and a second sub-ADC to resolve a second set of bits of the digital code according to successive approximation principle (SAP). By resolving some bits in parallel mode (i.e., all bits generated substantially simultaneously, for example, in the same clock cycle), the overall speed of conversion may be enhanced. By resolving some bits using SAP, the advantages of the corresponding approach may also be obtained.

According to another aspect of the present invention, an ADC includes a first sub-ADC to resolve a first set of bits of the digital code, and a second sub-ADC to resolve a second set of bits of the digital code, with the second sub-ADC operating according to SAP and containing a charge redistribution digital to analog converter (DAC). The first sub-ADC is implemented not to rely on charge conservation for its operation.

As is well known in the relevant arts, charge redistribution technique requires storage of charge in capacitors representing the strength of the input sample, and the movement of stored charge between capacitors and fixed potential nodes (ground, etc.) during conversion to the corresponding digital representation. Generally, the stored charge is not allowed to leak away, i.e., (stored) charge needs to be conserved (charge conservation) for the duration of conversion, thereby facilitating accurate conversion of the strength of an analog sample to a digital value.

In an embodiment, the analog signal is provided in differential form on a pair of input paths, and the second sub-ADC is operable to receive a common mode voltage equaling a supply voltage or a ground voltage provided for the operation of the ADC. As a result, the ADC may be operated to consume minimal power.

According to yet another aspect of the present invention, an ADC includes a first sub-ADC to resolve a first set of bits of a digital code according to SAP and to provide a residue signal representing an unresolved portion of the sample. The ADC also includes a second sub-ADC to receive the residue signal and to generate a second set of bits of the digital code, with the first set of bits being in a more significant position compared to the second set of bits. The first sub-ADC contains a component which operates both as a comparator in resolving each of the first set of bits, and also as an amplifier in generating the residue signal. The noise contribution of the ADC may be reduced as a result, while also speeding up the resolution.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the features of the invention.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

The broad architecture of an ADC provided according to an aspect of the present invention will be clearer in comparison with the implementation of a SAR ADC. Accordingly, the description is provided first in reference to a SAR ADC.

SAR ADC

Figure 1:
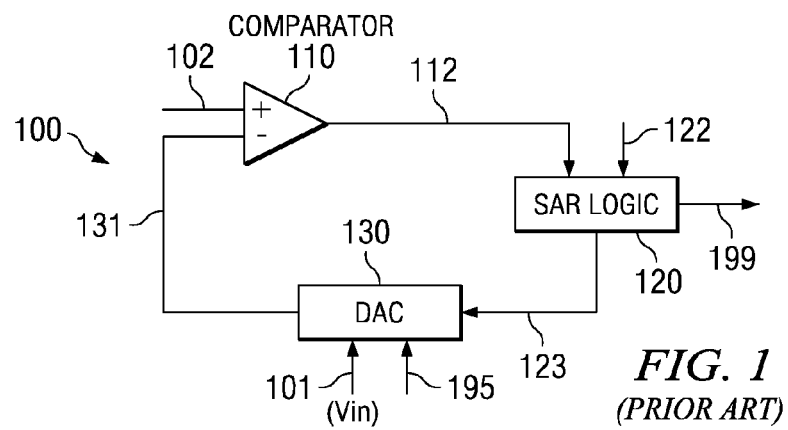
FIG. 1 is a block diagram illustrating of a prior SAR ADC in an embodiment.

FIG. 1 is a block diagram of an example successive approximation register (SAR) analog to digital Converter (ADC) in a prior embodiment. While the SAR ADC of FIG. 1 is shown implemented to process single-ended signals, several features of the present invention can be implemented in differential SAR ADCs as well. SAR ADC 100 is shown containing comparator 110, SAR logic 120, and digital to analog converter (DAC) 130. As is well known in the relevant arts, a SAR ADC generates a digital code representative of the strength of an input analog signal (at a sampled time instance) through a binary search process through all possible quantization levels.

Comparator 110 compares an intermediate analog signal received on path 131 against a D.C. reference voltage (for example, 0V ground) on path 102, and provides on path 112 the result of the comparison. In an embodiment, the result equals a logical value '1' if a sample of an analog signal on path 101 is greater than the signal value corresponding to the intermediate digital value (described below), else the result equals a logical value of '0'. Comparator 110 can be implemented in a known way.

SAR logic 120 determines the digital code corresponding to a sampled analog input value (on path 101) using successive approximation principle (for example, using binary search as noted above) by interfacing with comparator 110 and DAC 130. SAR logic 120 sends, on path 123, the intermediate digital value generated for each iteration of the binary search to determine a corresponding bit of the output digital code provided on path 199. The first iteration of the binary search starts typically with a digital value representing half of the full scale range being provided by SAR logic 120 on path 123. Clock 122 controls the duration of each iteration. Typically, assuming SAR ADC 100 has N bits of resolution (digital output code 199 is N-bits wide), N clock cycles may be required (one cycle to resolve each bit) to generate the final (complete) output code (199).

DAC 130 samples the analog signal received on path 101 (the sampling duration generally being termed an acquisition phase) before the conversion to digital representation performed during a conversion or quantization phase. DAC 130 then generates intermediate analog signal (or voltage) 131 having a voltage level equaling (Vdc−Vin+a voltage level corresponding to an intermediate digital value received on path 123) in each iteration, wherein Vin represents the voltage level of the sampled analog signal, and Vdc is the DC voltage on path 102. Input analog signal 101 may be provided via a buffer amplifier, not shown in FIG. 1.

Path 195 provides a stable reference voltage (Vref) that is used in generating intermediate analog voltage 131. For example, assuming that the intermediate digital value (on path 123) equals Q and reference voltage 195 equals Vref, then the voltage level corresponding to the digital value equals $(Vref*Q)/2^N$, wherein N represents the number of bits in the digital code generated by the ADC. Vref may be provided by a buffer (not shown).

One problem with the above described ADC is that the total time to generate a digital code corresponding to a sample may be unacceptably long. As noted above, a SAR ADC generally requires one clock cycle (e.g., T1) to determine one bit of the output digital code, which in turn generally depends on the speed of DAC 130 to resolve each bit.

Consequently, when the output digital code is desired to have a larger number of bits (higher resolution), more time may be required to perform the conversion. One possible solution is to implement DAC 130 with a high-speed, high bandwidth comparator. However, such an approach may increase the overall noise (inaccuracy) of SAR ADC 100.

An aspect of the present invention overcomes such a drawback as described below with respect to FIG. 4.

Additional aspects of the present invention overcome some other problems, which can be appreciated in comparison with an implementation of FIG. 1, and accordingly such an implementation is described next.

Prior Implementation of a SAR ADC

Figure 2B:
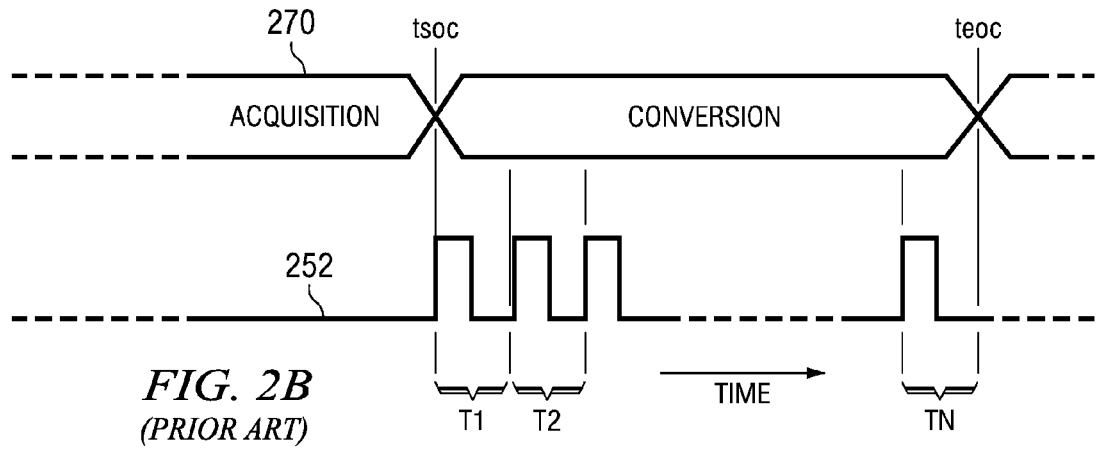
FIG. 2B is a timing diagram illustrating the operation of a prior SAR ADC.
Figure 2A:
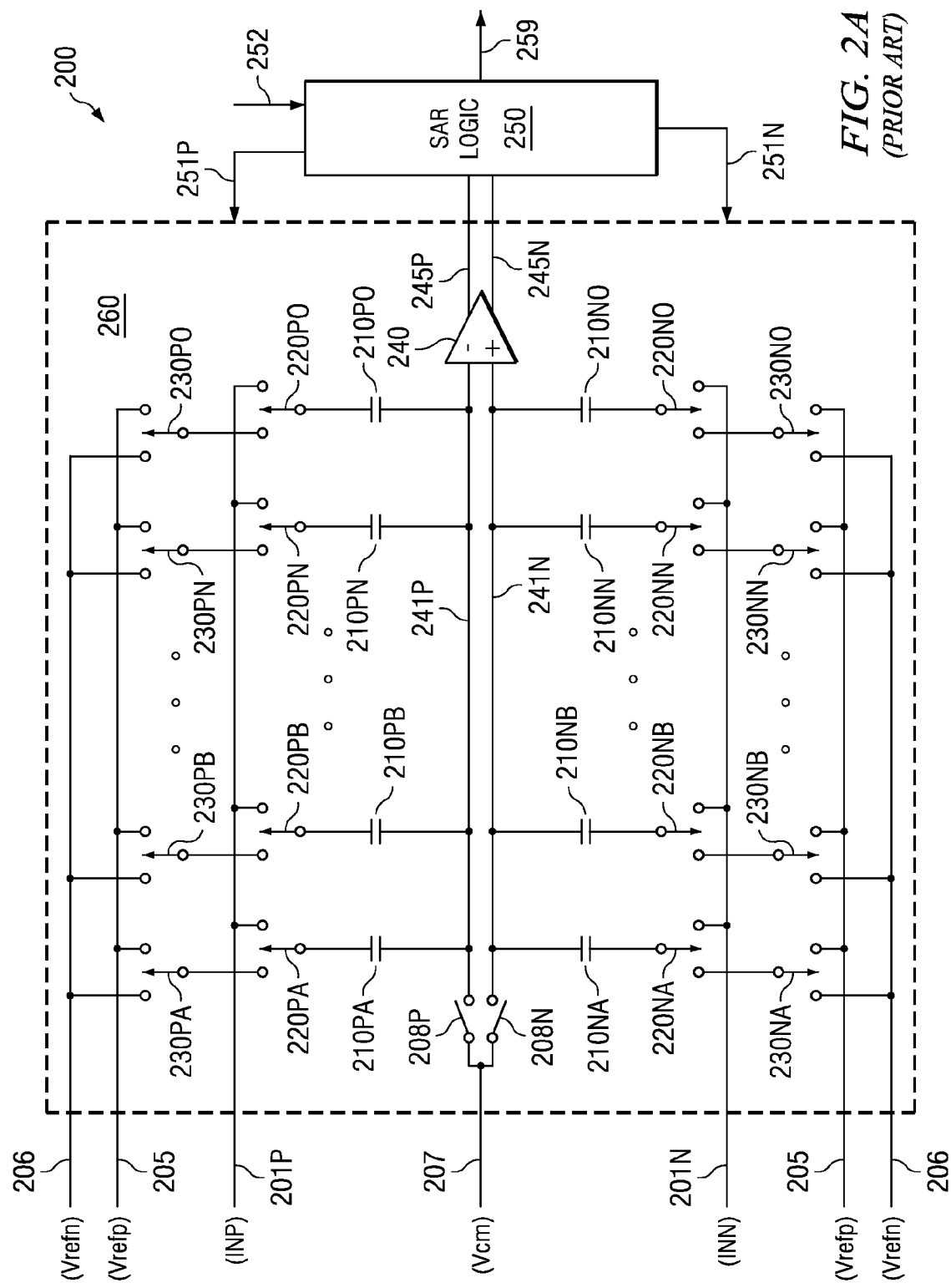
FIG. 2A is a diagram illustrating the details of a SAR ADC using charge redistribution, in a prior embodiment.

FIG. 2A is a diagram of a charge redistribution SAR ADC implemented to process differential signals in a prior embodiment. SAR ADC 200 is shown containing charge redistribution DAC (CDAC 260) and SAR logic 250. For clarity, power supplies (positive Vdd, negative Vee), as well as ground connections, are assumed to be present, but not shown in the Figure. Input terminals/paths 201P and 210N correspond to input terminal 101 of FIG. 1.

CDAC 260 is shown containing comparator 240, capacitor banks 210PA through 210PO, and 210NA through 210NO, switches 220PA through 220PO, 220NA through 220NO, 230PA through 230PO, and 230NA through 230NO, and switches 208P and 208N. The closing or opening of each of the switches 208P, 220PA through 220PO, and 230PA through 230PO is controlled by corresponding switch control signals provided on path 251P. The closing or opening of each of the switches 208N, 220NA through 220NO, and 230NA through 230NO are controlled by corresponding switch control signals provided on path 251N. 201P (INP) and 201N (INN) represent input terminals across which a differential input is received.

Reference voltages Vrefp and Vrefn (corresponding to 195 in FIG. 1) are provided on terminals 205 and 206 respectively. Assuming SAR ADC 100 operates using a single power supply, Vrefp may be connected to the power supply terminal (Vdd, not shown), Vrefn may be connected to ground (not shown), and common mode reference Vcm (207) may be connected to a voltage Vrefp/2 (generated internally or via an additional buffer, not shown). Assuming SAR ADC 200 operates using split-supplies (positive and negative power supplies), Vrefp may be connected to the positive power supply terminal (Vdd), Vrefn may be connected to the negative power supply terminal (Vee), and common mode reference Vcm (207) may be connected to ground.

Capacitance values of capacitors 210PA-210PN are related in a binary weighted manner. Similarly, capacitance values of capacitors 210NA-210NN are also related in a binary weighted manner. Assuming, for example that SAR ADC 200 provides a 6-bit digital representation of an analog input INP/INN, the number of capacitors 210PA-210PN equals six, with the respective capacitances having values C/2, C/4, C/8, C/16, C/32, and C/64.

Similarly, number of capacitors 210NA-210NN also equals six, with the respective capacitances having values C/2, C/4, C/8, C/16, C/32, and C/64. The capacitors with value C/2 correspond to the most significant bit (MSB) of the digital code 259, the capacitors with values C/4, C/8, C/16, C/32 and C/64 corresponding to the successive lesser significant bits, with capacitor with value C/64 corresponding to the least significant bit (LSB).

Capacitors 210PO and 210NO are dummy (balance) capacitors, each with capacitance value equal to the smallest capacitance in the set 210PA-210PN (or 210NA-210NN), i.e., C/64 in the above example. The total capacitance of each capacitor bank equals C, and the top plates of the capacitors in each bank are connected respectively to paths 241P and 241N (non-inverting and inverting terminal inputs of comparator 240). Comparator 240 provides comparison results of voltage values on paths 241P and 241N in differential form across terminals 245P and 246P. The operation of SAR ADC 200 is described next briefly with reference to the timing diagram of FIG. 2B.

Waveform 270 of FIG. 2B shows one acquisition phase and one conversion phase of operation of SAR ADC 100. During an acquisition phase (starting earlier than and ending at time instance tsoc, FIG. 2B) switches 208P and 208N are closed, switches 220PA through 220PO are connected to (INP), 220NA through 220NO are connected to INN, and input signal (Vin) across INP and INN is stored in capacitor banks 210PA through 210PN and 210NA through 210NN.

At time instance tsoc, a start of conversion command may be received (for example, from a processor, not shown), and switches 208P and 208N are opened. Thus, a sample of the input signal is stored (acquired) at tsoc, and a corresponding conversion phase (interval from time instances tsoc to teoc) begins, in which the digital representation of the sampled input is generated. Clock 252 is inactive during the acquisition phase, and active during the conversion phase, as shown in FIG. 2B.

The conversion phase (also termed quantization phase) begins with the bottom plates of capacitors 210PA through 210PN, and capacitors 210NA through 210NN being connected either to Vrefp or Vrefn, via corresponding switches in switch sets 220PA through 220PO, 220NA through 220NO, 230PA through 230PO, and 230NA through 230NO. It is assumed in the following description that at the start of the conversion phase the bottom plates of capacitors 210PA through 210PN, and capacitors 210NA through 210NN are connected to Vrefn.

At the start of the first clock cycle T1 (the start either coinciding with the start of the conversion phase tsoc, or occurring after a slight delay), the bottom plates of capacitors 210PA and 210NA (values C/2 each) are each connected to Vrefp via corresponding switches. Since, capacitor 210PA forms a 1:1 divider with the remaining capacitors in capacitor bank 210PA through 210PN (capacitor 210NA similarly forming a 1:1 divider with the remaining capacitors in capacitor bank 210NA through 210NN), the voltage value Vdiff across paths 241P and 241N provided as input to comparator 240 may be expressed by the following equation:

$$Vdiff = -Vin + [(Vrefp - Vrefn)/2] + Vcm \qquad \text{Equation 1}$$

Wherein,

Vdiff is the voltage across terminals 241P and 241N,
Vin is the stored input voltage during the acquisition phase,
Vrefp, Vrefn and Vcm have meanings as noted above.

Assuming, for simplicity, that SAR ADC 100 is operated using a single supply, equation 1 reduces to equation 2 below, since Vrefn and Vcm are connected to ground:

$$Vdiff = -Vin + (Vrefp/2) \qquad \text{Equation 2}$$

If sampled voltage Vin is greater than Vrefp/2, then from equation 2, Vdiff is negative (less than 0V or ground), and the output of comparator 240 output goes to logic high. This logic high (one) value is stored in SAR logic 250 and equals the MSB of the digital code to be generated corresponding to the stored sample Vin. However, if Vin is less than Vrefp/2, then Vdiff is positive, and the MSB is generated as a zero. The determination of the MSB noted above is performed during T1.

At the start of the next clock cycle T2, the bottom plates of the next pair of capacitors 210PB and 210NB (values C/4 each) are each connected to Vrefp via the corresponding switches. Also, if the first conversion step (during T1) determined that the corresponding bit (MSB) was a logic one, the bottom plates of capacitors 210PA and 210NA are reconnected to Vrefn to discharge these capacitors.

If the MSB was determined to be a logic zero, the bottom plates of capacitors 210PA and 210NA remain connected to Vrefp. Comparator 240 provides an output depending on the input voltage across terminals 241P and 241N, with SAR logic 250 storing the output of comparator 240 at the end of T2 as the next most significant bit. The binary weighted successive approximation technique is similarly repeated by SAR logic 250 till all N bits are determined (with the $N^{th}$ bit being determined at the end of the Nth clock cycle TN (FIG. 2B)).

The prior approach described above has some drawbacks. One drawback is that (in a single-supply SAR ADC) providing a value of Vrefp/2 to Vcm (during the acquisition phase) may require the use of a buffer, which consumes power during the acquisition phase. It may be desirable that SAR ADC 100 consume very little power (ideally zero) during the acquisition phase. A possible solution is to connect Vcm to ground or supply rail. However, such an approach causes the stored charge (representing a sample of an input signal acquired during an acquisition phase) to leak away through switches 208P and 208N due to the voltage on the top plates of the capacitor banks going beyond the supply rails.

Figure 3:
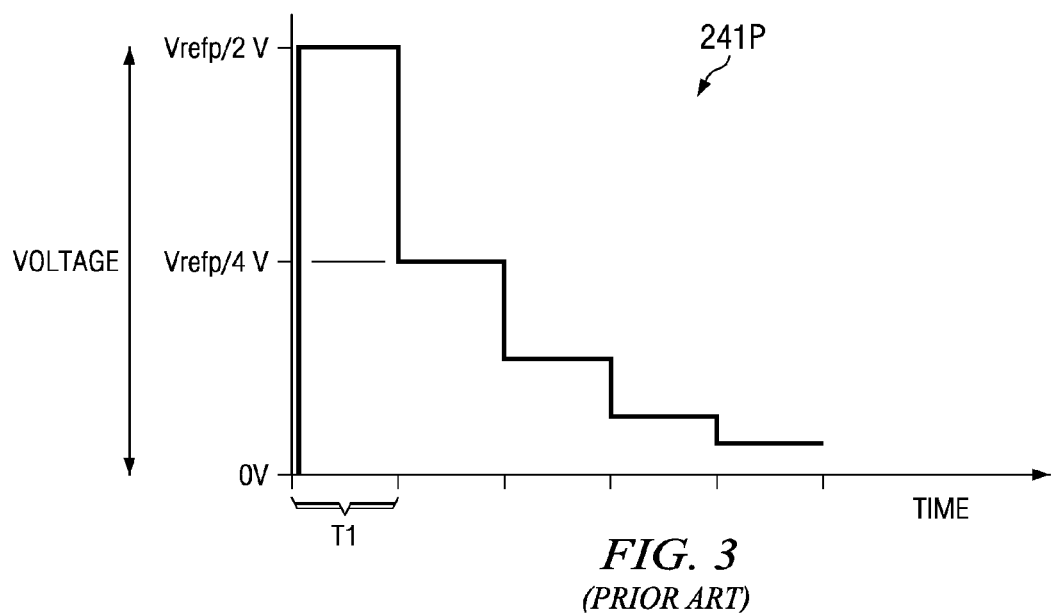
FIG. 3 is an example voltage waveform on the top plate of capacitors in a prior SAR ADC during a conversion phase in one embodiment.

FIG. 3 illustrates one example of such a scenario. The Figure shows the voltage waveform at node 241P (connected to the top plates of capacitor banks 210PA-210PO), assuming the sampled input voltage equals zero volts, and SAR ADC 200 operates using a single supply. It may be observed that in the first iteration (clock cycle T1, noted above), the voltage on node 241P is Vref/2 volts away from ground (0V).

This may cause parasitic diodes (inherently formed during fabrication) in switch 208P to be turned on, and cause the stored charge in capacitor bank 210A-210O to leak (discharge) to ground via switch 208P. In subsequent cycles (only a total of five cycles are shown in FIG. 3), the voltage on path 241P reduces, as SAR ADC 100 resolves successive lower significant bits. The voltage on node 241N is complementary (inverse) of the voltage on node 241P, and a similar leakage of the stored charge on capacitor banks 210NA-210NO may also occur.

For other values of input Vin, the voltages may be correspondingly different. Since the error in the initial approximation may be as large as ±Vrefp/2 with respect to input Vin, charge leakage may occur, thereby potentially resulting in an error in the digital codes generated by SAR ADC 200. An approach intended to overcome problems similar to those noted above is described in U.S. Pat. No. 6,667,707, entitled, "Analog-to-digital converter with the ability to asynchronously sample signals without bias or reference voltage power consumption", issued to Mueck et al.

Several aspects of the present invention address one or more of the problems noted above, as described next with respect to example embodiments.

Improved ADC

Figure 4:
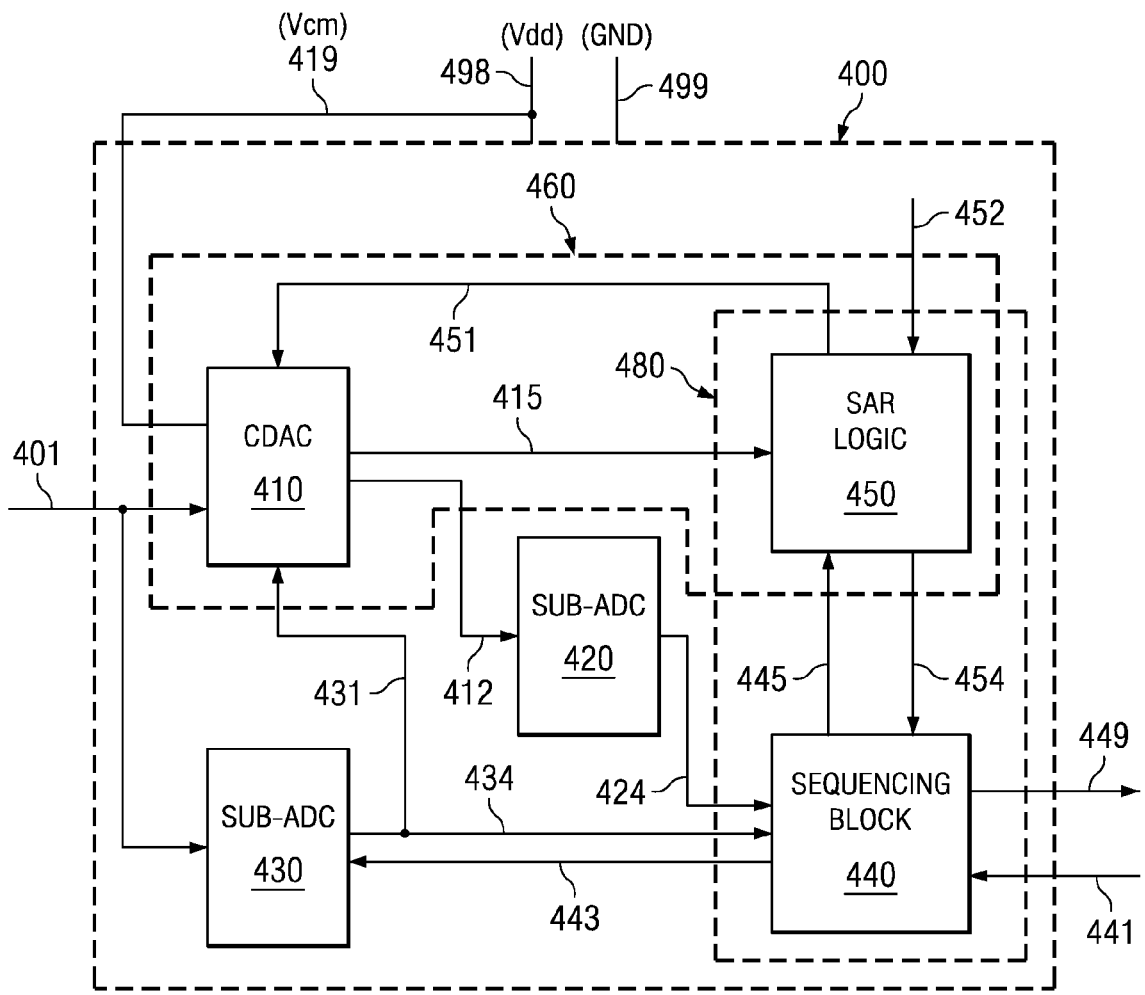
FIG. 4 is a block diagram illustrating the details of an ADC in an embodiment of the present invention.

FIG. 4 is a block diagram of an ADC that uses successive approximation techniques, in an embodiment of the present invention. ADC 400 is shown containing CDAC 410, sub-ADC 420, sub-ADC 430, SAR logic 450, and sequencing block 440. The combination of CDAC 410 and SAR logic 450 may be viewed as operating as a sub-ADC according to the successive approximation principle (SAP) and using a DAC internally (CDAC 410) that uses charge redistribution techniques, and the combination is also referred to below as SAR sub-ADC 460. SAR logic 450 and sequencing block 440 may together be viewed as control block 480.

ADC 400 receives an analog input on path 401, and provides a corresponding N-bit digital code on path 449. Analog input 401 is provided in parallel (or simultaneously) to both SAR sub-ADC 460 and sub-ADC 430. It is assumed in the following description that SAR sub-ADC 460 is implemented to process signals in a differential format, and operates from a single power supply marked in the Figure as Vdd (498). The ground terminal is marked as terminal 499. Common mode voltage Vcm (419) is shown connected to power supply terminal 498, but in the alternative may also be connected to the ground terminal 499. Reference voltages required for operation of SAR sub-ADC 460 are assumed to be Vdd (498) and ground (499)

Paths 401 and 412 may be differential paths, while paths 412, 424, 431 and 434 may be single-ended. However, it is understood that in different embodiments, the paths may be differential or single-ended depending on the specific implementation. Further, the blocks and interconnections between them in FIG. 4 are merely illustrative. It will be apparent to one skilled in the relevant arts that other combinations and interconnections are also possible. Similarly, while SAR logic 450 and sequencing block 440 are shown as separate blocks, these may also be implemented as a single logic block (control block 480).

Figure 5:
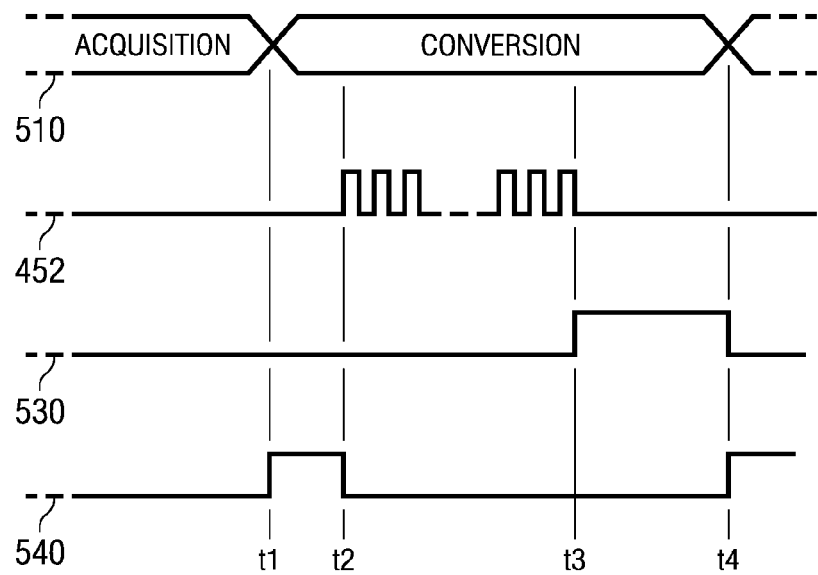
FIG. 5 is a timing diagram illustrating the operation of an ADC in an embodiment of the present invention.

Further, the timing of various operations illustrated with respect to FIG. 5 assumes zero delays, while typical operation may entail corresponding delays, as is well known in the relevant arts. The operation of ADC 400 is described next with combined reference to FIG. 4 and the example timing diagram of FIG. 5.

SAR sub-ADC 460 acquires input signal 401 (in time duration denoted by the "acquisition" phase in waveform 510, prior to time instance t1). The acquisition phase is asynchronous, and may be performed similar to that described with respect to FIG. 2B. The conversion phase starts at time instance t1 (for example, in response to a "start conversion" command that may be provided, via path 441, to sequencing block 440 of control block 480). Sequencing block 440 may, in turn, forward the "start conversion" command via path 443 to sub-ADC 430. Alternatively, the "start conversion" command may be provided directly to sub-ADC 430.

In contrast with the prior SAR ADC described above, SAR sub-ADC 460 does not start the conversion operation at time instance t1, and clock 452 (used for the conversion operation of SAR sub-ADC 460) is inactive between time instances t1 and t2. Instead, during time interval t1 to t2 (represented by the logic high portion of waveform 540 in FIG. 5), sub-ADC 430 generates an intermediate digital code representing input 401 with a predetermined resolution less than the resolution of the digital code/representation 459.

Assuming, for example, that ADC 400 provides an N-bit output code (459), sub-ADC 430 generates the 'L' most significant bits (MSB) of the N-bit code, and forwards the 'L' MSBs to sequencing block 440 on path 434. Sequencing block 440 stores, as well as forwards the L MSBs to SAR logic 450 on path 445. At time instance t2, sequencing block 440 may provide an indication (or command) to SAR logic 450 (via path 445) to commence the conversion operation according to successive approximation principle. Alternatively, such indication may be provided (at t2) directly by sub-ADC 430 via path 431.

At time instance t2, SAR logic 450 provides the L-bit intermediate code to CDAC 410 as the initial approximation of analog input 401. CDAC 410 (in conjunction with and under control of SAR logic 450 via path 451) generates the next (N−L−M, wherein '−' represents the subtraction operation) bits of the N-bit digital code 459, with the M bits being generated by sub-ADC 420 (as described below). The conversion process of SAR sub-ADC 460 is performed according to the charge redistribution principle, with CDAC 410 providing comparison results during each clock cycle (clock 452, shown active in interval t2-t3 in FIG. 5) to SAR logic 450 via path 415, and receiving a next approximation code (according to the successive approximation technique) from SAR logic 450 via path 451. At time instance t3, SAR logic 450 forwards the L resolved bits to sequencing block 440 via path 454.

The conversion duration of SAR sub-ADC 460 is indicated in FIG. 5 by the time interval between t2 and t3. It may be noted that clock 452 is active (and may contain N−L−M clock cycles) during the interval t2-t3. At time instance t3, CDAC 410 provides the 'remainder' (residue) of the analog signal representing the not-yet-resolved portion (corresponding to the least significant M bits) in an amplified form to sub-ADC 420 on path 412. The internal details of CDAC 410 in one embodiment, are illustrated below with respect to FIG. 6.

Sub-ADC 420 resolves the amplified residue to generate the least significant M-bits of the N-bit digital code 459 during time interval t3 to t4 (indicated by a logic high in waveform 530 in FIG. 5), and forwards the M bits to sequencing logic 440 on path 424. It is noted that SAR sub-ADC 460 may commence acquisition of the next sample of input 401 at time instance t3, thereby increasing the overall throughput (speed) of ADC 400. Sequencing block 440 combines the resolved bits provided by each of sub-ADC 430, SAR sub-ADC 460 and sub-ADC 420, and provides at time instance t4 a final N-bit digital code representing the sampled analog signal 401 on path 449.

Sub-ADC 430 may be implemented using any technique other than one based on or relying on charge conservation, according to an aspect of the present invention. In an embodiment, sub-ADC 430 is implemented as a flash ADC (and therefore generates the corresponding L bits in parallel, as opposed to sequentially), as described below. Sub-ADC 420 may also be implemented as a parallel (flash) ADC, in a known way. In an embodiment of the present invention, ADC 400 is implemented as an 18-bit ADC, with sub-ADC 430 providing the 5 most significant bits, SAR-sub-ADC 460 providing the next 8 bits, and sub-ADC 420 providing the 5 least significant bits of the 18-bit digital code (449).

From the description above, it may be noted that in contrast to prior SAR ADC 200 (FIG. 2), the initial approximation provided by the SAR logic 450 corresponds to the (L+1) most significant bits (with L bits having been generated by sub-ADC 430). As a result, errors during the conversion process of SAR sub-ADC 460 are limited to within the voltage range $[-V_s/2^{L+1}, +V_s/2^{L+1}]$. The value of L is made large enough (5 in the example as noted above) such that the problem of charge leakage noted with respect to the prior approach (and therefore the consequent inaccuracies in output digital code 449) are minimal or zero, even when Vcm (419) is connected to the power supply terminal Vdd (499).

A buffer may not be required to drive the top-plates of capacitors in the input-sampling capacitor banks in CDAC 410 to Vdd/2 to minimize the charge leakage problem. Consequently, during the acquisition phase, most portions (e.g., amplifier 640, sub-ADC 420, sub-ADC 430, SAR logic 450 and sequencing block 440) of ADC 400 may be powered down. Therefore, power consumption during the acquisition phase may be minimized or completely reduced to zero. Further, since sub-ADC 420 may be implemented to resolve the M LSBs in a parallel mode (e.g., using flash ADC architecture), the total time to generate digital code 449 is reduced. The internal details of CDAC 410 in one embodiment are described next briefly.

CDAC

Figure 6:
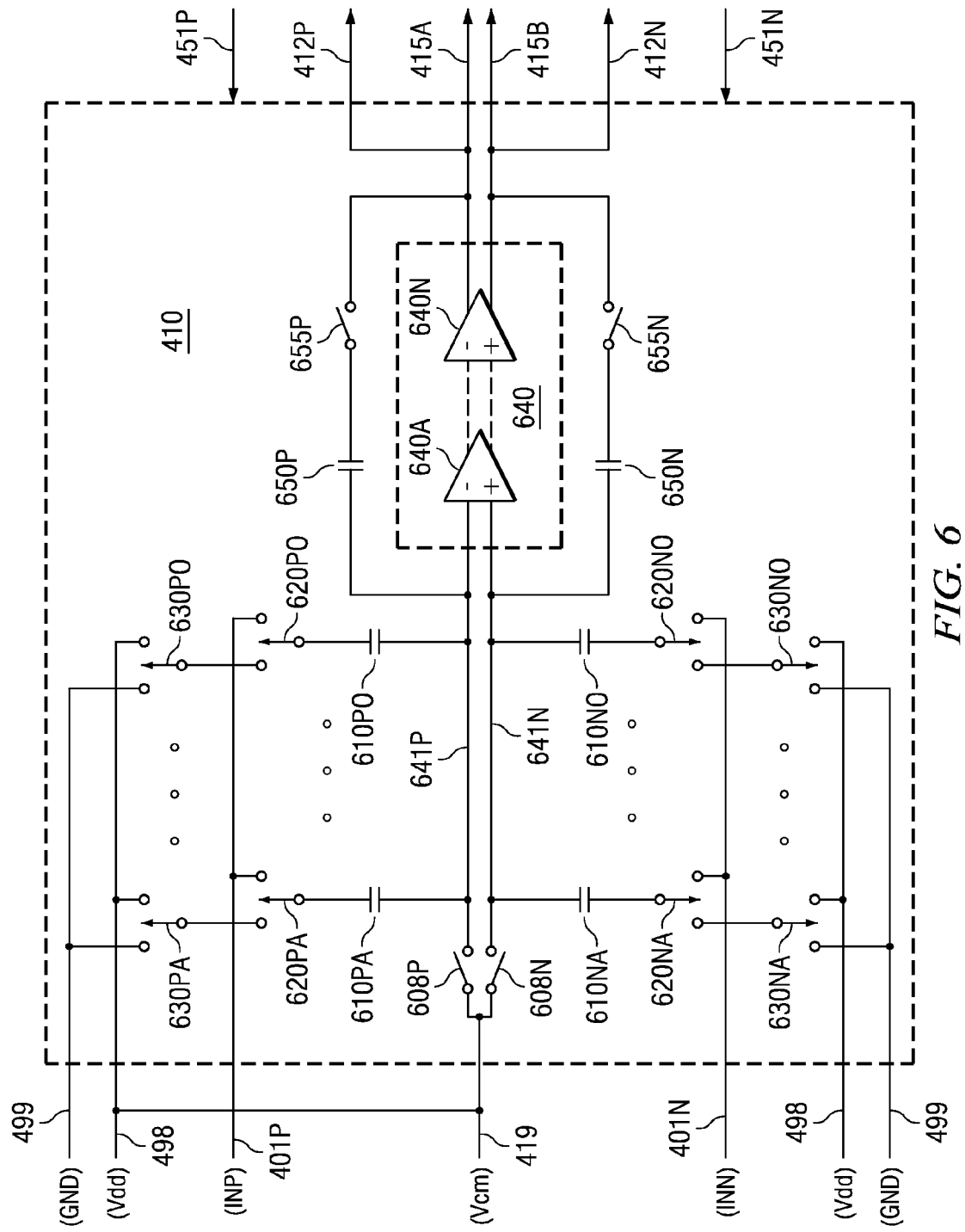
FIG. 6 is a diagram illustrating the internal details of a charge redistribution DAC in an ADC, in an embodiment of the present invention.

FIG. 6 is a diagram illustrating the details of a CDAC used in a SAR sub-ADC portion of an ADC in an embodiment of the present invention. CDAC (charge redistribution digital to analog converter) 410 is shown containing capacitor banks 610PA through 610PO, and 610NA through 610NO, switches 620PA through 620PO, 620NA through 620NO, 630PA through 630PO, and 630NA through 630NO, switches 608P and 608N, amplifier 640, feedback capacitors 650P and 650N, and feedback switches 655P and 655N. Input analog signal 401 (FIG. 4) is provided via differential paths 401P (INP) and 401N (INN). Paths 451P and 451N are deemed to be contained in path 451 (FIG. 4). Similarly, differential outputs 412P/412N are deemed to be contained respectively in paths 415 and 412 of FIG. 4.

Power supply voltage Vdd (498) is used as the higher reference voltage, while ground (499) is used as the lower reference voltage. Common mode reference Vcm (419) is shown connected to Vdd (498), but in the alternative may also be connected to ground (499). The closing or opening of the switches in FIG. 6 is controlled by SAR logic 450 (FIG. 4) via paths 451P and 451N (both of which are deemed to be present in path 451 of FIG. 4). Amplifier 640, which may be implemented to contain multiple stages 640A through 640N, is operated as a comparator during the conversion time interval t2-t3 (FIG. 5), with switches 655P and 655N being open. Amplifier 640 may be implemented as an operational amplifier in a known way.

The combination of SAR logic 450 (FIG. 4), capacitor banks 610PA through 610PO, and 610NA through 610NO, switches 620PA through 620PO, 620NA through 620NO, 630PA through 630PO, and 630NA through 630NO, switches 608P and 608N operates similar to the corresponding circuitry described in detail with respect to FIG. 2A according to the charge redistribution principle, and therefore the description is not repeated here in the interest of conciseness. It is noted in particular, however, that since the initial approximation provided to CDAC 410 is correct (resolved) to L bits (by sub-ADC 430, as described above), the voltage excursions on inverting (641P) and non-inverting (641N) inputs of amplifier 640 may be negligible.

Figure 7A:
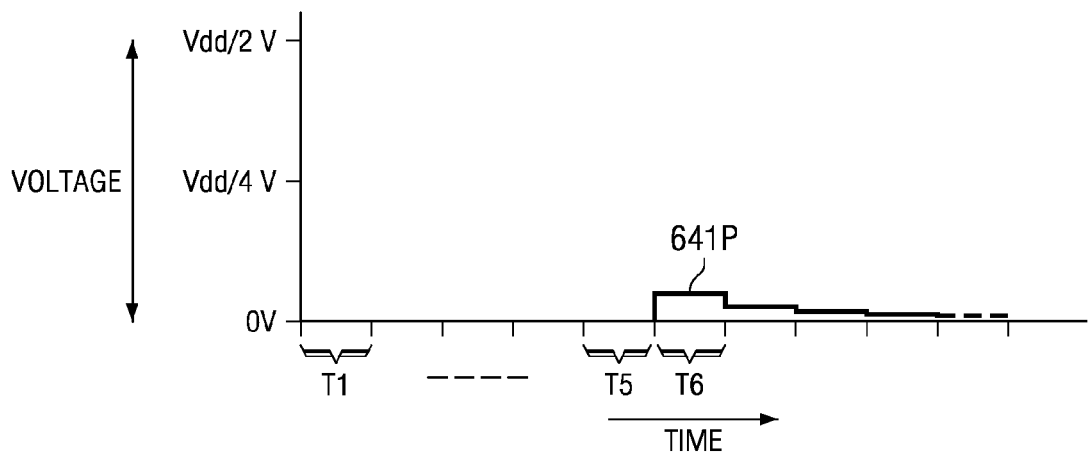
FIG. 7A is a waveform illustrating the voltage level (not to scale) at the top plates of capacitors in a CDAC in an embodiment of the present invention.

FIG. 7 (not to scale) illustrates an example voltage waveform at node 641P (connected to the top plates of capacitor banks 210PA-210PO), assuming the sampled input voltage equals zero volts, Vref of FIG. 3 being equal to Vdd of FIG. 7, and the initial approximation provided by SAR logic 450 (via switch-control paths 451P and 451N) is correct to 5 bits (resolved by sub-ADC 430).

It may be observed that compared to the waveform in FIG. 3, the magnitudes of the voltage excursions at node 641P (connected to top plates of capacitors 610PA-610PO) are much lesser. As a result, charge leakage and the consequent inaccuracy in the output digital codes are minimized. Further, Vcm (419) may be tied to either the power supply or ground terminals, with an additional buffer not being required, thereby minimizing (or reducing to zero) the power consumption of ADC 400 during the acquisition phase.

Each of capacitors in capacitor banks 610PA-610PO and 610NA-610NO may be split into halves (physically implemented as a pair of capacitors connected in parallel) to reduce the drive requirement from the reference voltage (Vdd). It is noted here that when operated as a comparator (during the interval t2-t3), amplifier 640 provides a pair of binary outputs 415A and 415B. Outputs 415A and 415B having different binary values (0 and 1, or 1 and 0) indicates to SAR logic 450 that the comparison result is either a large positive value (voltage 641P being much higher than voltage 641N) or a large negative (voltage 641P being much lower than voltage 641N) value.

When the two outputs have the same binary value, it indicates that the difference between the voltages 641P and 641N is very small. Such a comparator implementation enables SAR sub-ADC 460 to determine $\log_2 3$-bits per clock cycle (of clock 452), thereby enabling speeding up of the binary SAR decisions due to the redundancy of resolving more than 1 bit per clock, while effectively applying only 1 bit on sampling CDAC 410.

After completion of conversion of the (N–L–M) bits in time interval t2-t3, switches 655P and 655N are closed (via paths 451P and 451N), and amplifier 640 (operating now in a continuous-time, amplifier mode) provides the residue (the not-yet-resolved portion of the input sample) to sub-ADC 420 across differential paths 412P/412N. The residue amplification can be done in a single clock cycle, although such is not shown in the timing diagram of FIG. 5 for ease of description.

It is noted here that noise contribution from a comparator (for example, amplifier 640 in comparator mode during time interval t2-t3) is generally a significant portion of the overall error in a high-resolution ADC. High-speed comparators require high-bandwidth in order to resolve bits correctly in a short time, but contribute higher noise. In comparison, when operated as an amplifier, amplifier 640 contributes lesser noise.

Figure 7B:
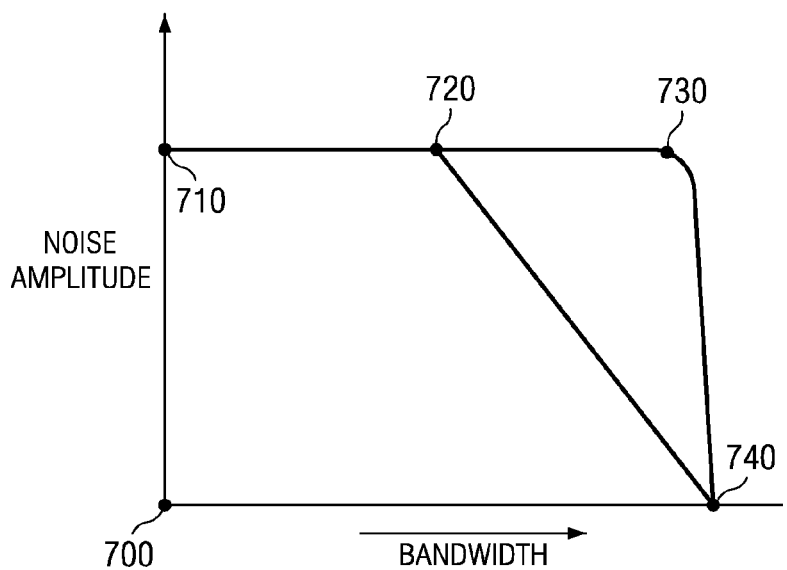
FIG. 7B is a graph illustrating bandwidth versus noise of an amplifier/comparator used in a CDAC in an embodiment of the present invention.

In FIG. 7B, the area of the portion formed by points 700, 710, 720 and 740 represents the noise contribution of amplifier 640 when operated as an amplifier, while the area of the portion formed by points 700, 710, 720, 730 and 740 represents the noise contribution of amplifier 640 when operated as a comparator. Relevant mathematical analysis of amplifier 640 is provided in the provisional application noted above in the related applications section.

Therefore, the use of amplifier 640 as a residue amplifier in continuous-time feedback mode results in reducing the noise contribution within ADC 400. Further, since the residue is resolved subsequently by sub-ADC 420 in a parallel (flash) mode, the overall speed of ADC 400 is improved.

System/Device

Figure 8:
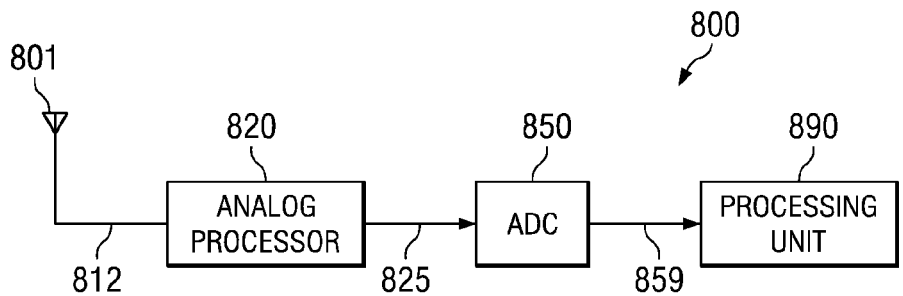
FIG. 8 is block diagram of an example system/device in which several aspects of the present invention can be implemented.

FIG. 8 is a block diagram of receiver system 800 illustrating an example system in which several aspects of the present invention may be implemented. Receiver system 800, which may correspond to, for example, a mobile phone is shown containing antenna 810, analog processor 820, ADC 850, and processing unit 890.

Antenna 810 may receive various signals transmitted over a wireless medium. The received signals may be provided to analog processor 820 on path 812 for further processing. Analog processor 820 may perform tasks such as amplification (or attenuation as desired), filtering, frequency conversion, etc., on received signals and provides the resulting signal on path 825.

ADC 850 converts the analog signal received on path 825 to corresponding digital codes at a sampling frequency. ADC 850 may be implemented as a high speed high resolution ADC using successive approximation principle in combination with one or more techniques described above. ADC 850 provides the digital codes to processing unit 890 on path 859 for further processing. Processing unit 890 receives the recovered data to provide various user applications (such as telephone calls, data applications).

In the instant application, the power and ground terminals are referred to as reference potentials, the source and drain terminals of transistors (though which a current path is provided when turned on and an open path is provided when turned off) are termed as current terminals, and the gate terminal is termed as a control terminal. Furthermore, though the terminals are shown with direct connections to various other terminals, it should be appreciated that additional components (as suited for the specific environment) may also be present in the path, and accordingly the connections may be viewed as being electrically coupled to the same connected terminals.

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. An analog to digital converter (ADC) comprising:
   a first sub-ADC that resolves a first set of bits;
   a second sub-ADC that resolves a second set of bits employing an acquisition phase and a conversion phase, wherein the second sub-ADC includes:
       a charge redistribution digital to analog converter (CDAC); and
       successive approximation register (SAR) logic that is coupled to the CDAC, wherein SAR logic and the first sub-ADC are powered down during the acquisition phase.

2. The ADC of claim 1, wherein an analog signal is provided in differential form on a pair of input paths to the ADC, and wherein the second sub-ADC operable to receive a common mode voltage equaling a supply voltage or ground provided for the operation of the ADC.

3. The ADC of claim 2, wherein the CDAC further comprises:
   a comparator having a pair of input terminals, wherein each of the input terminals receives the common mode voltage during the acquisition phase;
   a first set of capacitors having capacitance values in a binary weighted relationship, wherein each capacitor from the first set of capacitors is coupled to at least one of the input terminals of the comparator, and wherein each capacitor from the first set of capacitors is operable to be coupled to at least one of the input paths during the acquisition phase in which a sample is stored, and wherein each capacitor from the first set of capacitors is operable to be coupled to at least one of a pair of reference voltages during the conversion phase when the second set of bits are being resolved; and
   a second set of capacitors having capacitance values in a binary weighted relationship, wherein each capacitor from the second set of capacitors is coupled to at least one of the input terminals of the comparator, wherein each capacitor from the second set of capacitors is operable to be coupled to at least one of the input paths during the acquisition phase in which the sample is stored, and wherein each capacitor from the second set of capacitors is operable to be coupled to at least one of a pair of reference voltages during the conversion phase when the second set of bits are being resolved.

4. The ADC of claim 3, wherein the first set of bits are in a more significant bit positions than the second set of bits, wherein the SAR logic receives the first set of bits and uses the first set of bits as a start point in resolving the second set of bits according to a successive approximation principle (SAP).

5. The ADC of claim 4, wherein the ADC further comprises a third sub-ADC that resolves a third set of bits, and wherein the third set of bits are in a less significant bit position compared to the second set of bits.

6. The ADC of claim 5, wherein each of the first sub-ADC and the third sub-ADC respectively resolve the first set of bits and the third set of bits in a parallel mode.

7. The ADC of claim 5, wherein the second sub-ADC generates a residue signal representing unresolved portion of the sample, the third sub-ADC generating the third set of bits based on the residue signal.

8. An ADC comprising:
   a first sub-ADC that resolves a first set of bits of and provides a residue signal representing an unresolved portion of a sample, wherein the first sub-ADC includes at least one operation amplifier with a feedback capacitor that is connected between an input and an output of the operational amplifier to operate the operational amplifier as an amplifier and that is disconnected operate the operational amplifier as a comparator; and
   a second sub-ADC that receives the residue signal and resolves a second set of bits.

9. The ADC of claim 8, wherein the operational amplifier, when operated as the comparator, provides a pair of outputs, thereby enabling the first sub-ADC to resolve more than one bit per clock cycle.

10. The ADC of claim 8, wherein the second sub-ADC comprises:
- a comparator having a pair of input terminals, wherein each of the input terminals receives a common mode voltage during an acquisition phase;
- a first set of capacitors having capacitance values in a binary weighted relationship, wherein each capacitor from the first set of capacitors is coupled to at least one of the input terminals of the comparator, and wherein each capacitor from the first set of capacitors is operable to be coupled to at least one of the input paths during the acquisition phase in which a sample is stored, and wherein each capacitor from the first set of capacitors is operable to be coupled to at least one of a pair of reference voltages during a conversion phase when the second set of bits are being resolved;
- a second set of capacitors having capacitance values in a binary weighted relationship, wherein each capacitor from the second set of capacitors is coupled to at least one of the input terminals of the comparator, and wherein each capacitor from the second set of capacitors is operable to be coupled to at least one of the input paths during the acquisition phase in which the sample is stored, and wherein each capacitor from the second set of capacitors is operable to be coupled to at least one of a pair of reference voltages during the conversion phase when the second set of bits are being resolved; and
- SAR logic that is coupled to the comparator.

11. An ADC comprising:
- a first sub-ADC that resolves a first set of bits;
- a second sub-ADC that resolves a second set of bits using an SAP, wherein the second sub-ADC includes a CDAC having:
  - a comparator having a pair of input terminals, wherein each of the input terminals receives a common mode voltage during an acquisition phase;
  - a first set of capacitors having capacitance values in a binary weighted relationship, wherein each capacitor from the first set of capacitors is coupled to at least one of the input terminals of the comparator, and wherein each capacitor from the first set of capacitors is operable to be coupled to at least one of the input paths during the acquisition phase in which a sample is stored, and wherein each capacitor from the first set of capacitors is operable to be coupled to at least one of a pair of reference voltages during a conversion phase when the second set of bits are being resolved; and
  - a second set of capacitors having capacitance values in a binary weighted relationship, wherein each capacitor from the second set of capacitors is coupled to at least one of the input terminals of the comparator, and wherein each capacitor from the second set of capacitors is operable to be coupled to at least one of the input paths during the acquisition phase in which the sample is stored, and wherein each capacitor from the second set of capacitors is operable to be coupled to at least one of a pair of reference voltages during the conversion phase when the second set of bits are being resolved; and
- a third sub-ADC that resolves a third set of bits, wherein the first sub-ADC and the third sub-ADC resolve the first and third set of bits in a parallel mode.

12. The ADC of claim 11, wherein the second sub-ADC further comprises SAR logic that is coupled to the CDAC.

13. The ADC of claim 12, wherein the comparator further comprises:
- an operational amplifier having a pair of inputs and a pair of outputs;
- a first feedback capacitor;
- a second feedback capacitor;
- a first switch that is coupled in series with the first feedback capacitor between at least one of the inputs of the operational amplifier and at least one of the outputs of the operational amplifier; and
- a second switch that is coupled in series with the second feedback capacitor between at least one of the inputs of the operational amplifier and at least one of the outputs of the operational amplifier, wherein the operational amplifier operates as an amplifier when the first and second switches are activated, and wherein the operational amplifier operates as a comparator when the first and second switches are deactivated.

14. The ADC of claim 13, wherein the third sub-ADC receives a residue signal from the comparator when the operational amplifier is operating as an amplifier.

* * * * *